United States Patent
Lemont et al.

[11] Patent Number: 5,896,917
[45] Date of Patent: Apr. 27, 1999

[54] ACTIVE HEAT SINK STRUCTURE WITH FLOW AUGMENTING RINGS AND METHOD FOR REMOVING HEAT

[75] Inventors: Andrew I. Lemont, Derby; Jeffrey Radziunas, Wallingford, both of Conn.

[73] Assignee: Lemont Aircraft Corporation, Ansonia, Conn.

[21] Appl. No.: 08/763,483

[22] Filed: Dec. 11, 1996

Related U.S. Application Data

[60] Provisional application No. 60/012,098, Feb. 22, 1996.

[51] Int. Cl.$^6$ ..................................... H05K 7/20
[52] U.S. Cl. .......................... 165/80.3; 165/125; 165/185; 174/16.3; 257/722; 361/697
[58] Field of Search ................................. 165/80.3, 122, 165/125, 185; 174/15.2, 16.3; 257/715, 722; 361/695, 697, 698

[56] References Cited

U.S. PATENT DOCUMENTS

| | | |
|---|---|---|
| D. 357,900 | 5/1995 | Katsui et al. . |
| 3,149,666 | 9/1964 | Coe . |
| 3,285,328 | 11/1966 | Woodward ........................ 165/185 X |
| 4,237,521 | 12/1980 | Denker . |
| 4,840,225 | 6/1989 | Foley et al. . |
| 4,909,311 | 3/1990 | Nakamura et al. ................. 165/125 X |
| 5,288,203 | 2/1994 | Thomas ................................ 415/178 |
| 5,292,088 | 3/1994 | Lemont .................................. 244/65 |
| 5,297,617 | 3/1994 | Herbert ................................ 165/80.3 |
| 5,299,632 | 4/1994 | Lee . |
| 5,309,983 | 5/1994 | Bailey . |
| 5,335,722 | 8/1994 | Wu . |
| 5,353,863 | 10/1994 | Yu . |
| 5,381,859 | 1/1995 | Minakami et al. .................. 165/80.3 |
| 5,393,197 | 2/1995 | Lemont .................................. 415/68 |
| 5,445,215 | 8/1995 | Herbert . |
| 5,457,342 | 10/1995 | Herbst, II . |
| 5,470,202 | 11/1995 | Lemont .............................. 415/211.1 |
| 5,475,564 | 12/1995 | Choiu . |
| 5,486,980 | 1/1996 | Jordan et al. . |
| 5,494,098 | 2/1996 | Morosas . |
| 5,504,650 | 4/1996 | Katsui et al. ......................... 361/697 |
| 5,526,875 | 6/1996 | Lin . |
| 5,535,094 | 7/1996 | Nelson et al. . |
| 5,559,674 | 9/1996 | Katsui . |
| 5,583,746 | 12/1996 | Wang ..................................... 361/697 |

FOREIGN PATENT DOCUMENTS 73657 3/1990 Japan .................................... 257/722

*Primary Examiner*—Leonard R. Leo
*Attorney, Agent, or Firm*—St.Onge Steward Johnston & Reens LLC

[57] ABSTRACT

An active heat sink is described for use in the transfer of heat from a heat generating device such as a semiconductor chip and the like with a heat sink having an embedded fan surrounded by a plurality of heat conducting flow augmenting rings separated by apertures through which a radially inward flow arises and with the rings being sufficiently axially separated to enable fan propeller tip vortices to penetrate the axial spacings so as to cause a substantial cooling of annular ring regions so as to raise the overall heat transfer coefficient of the active heat sink in a significant manner. Several embodiments are described.

13 Claims, 14 Drawing Sheets

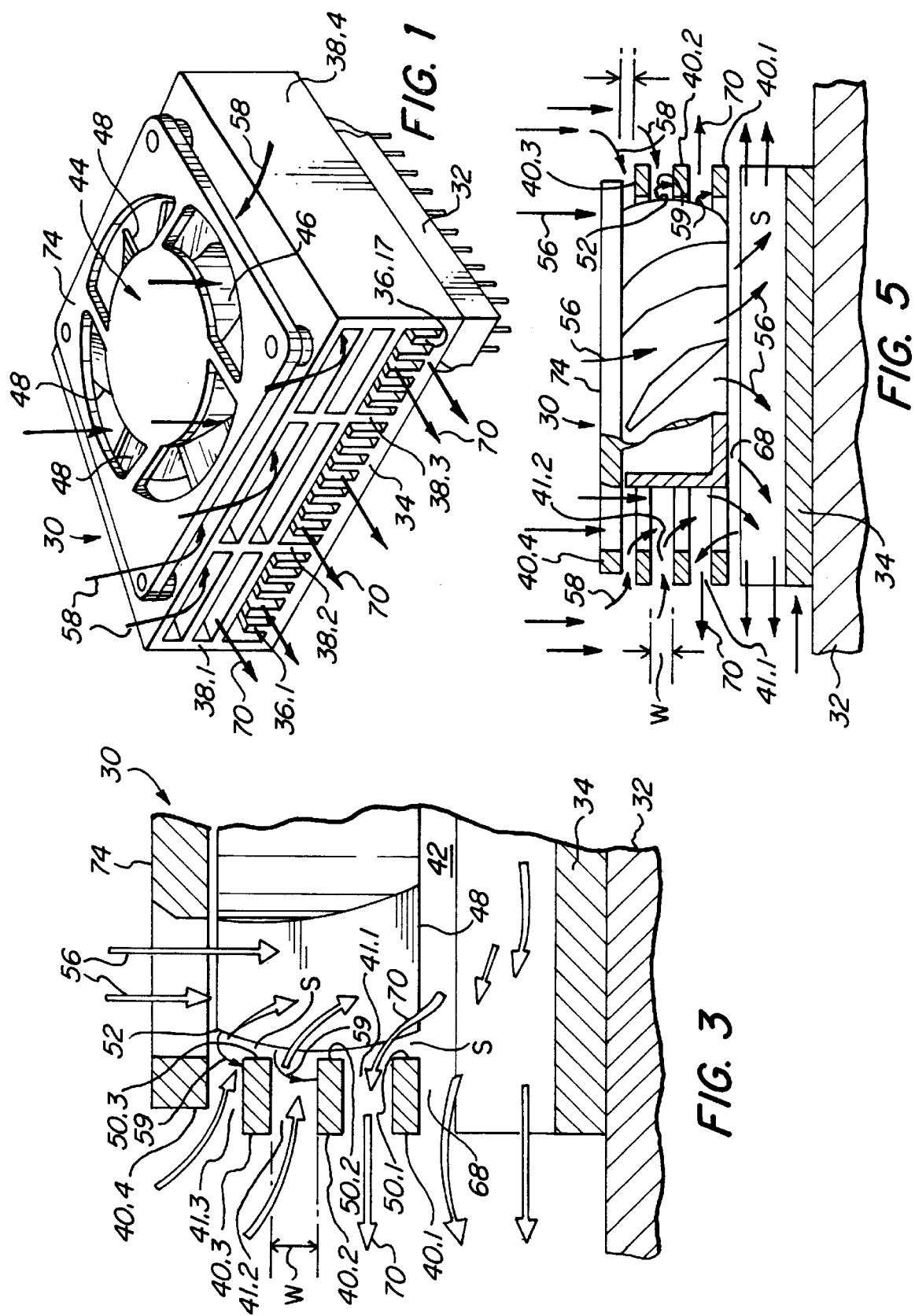

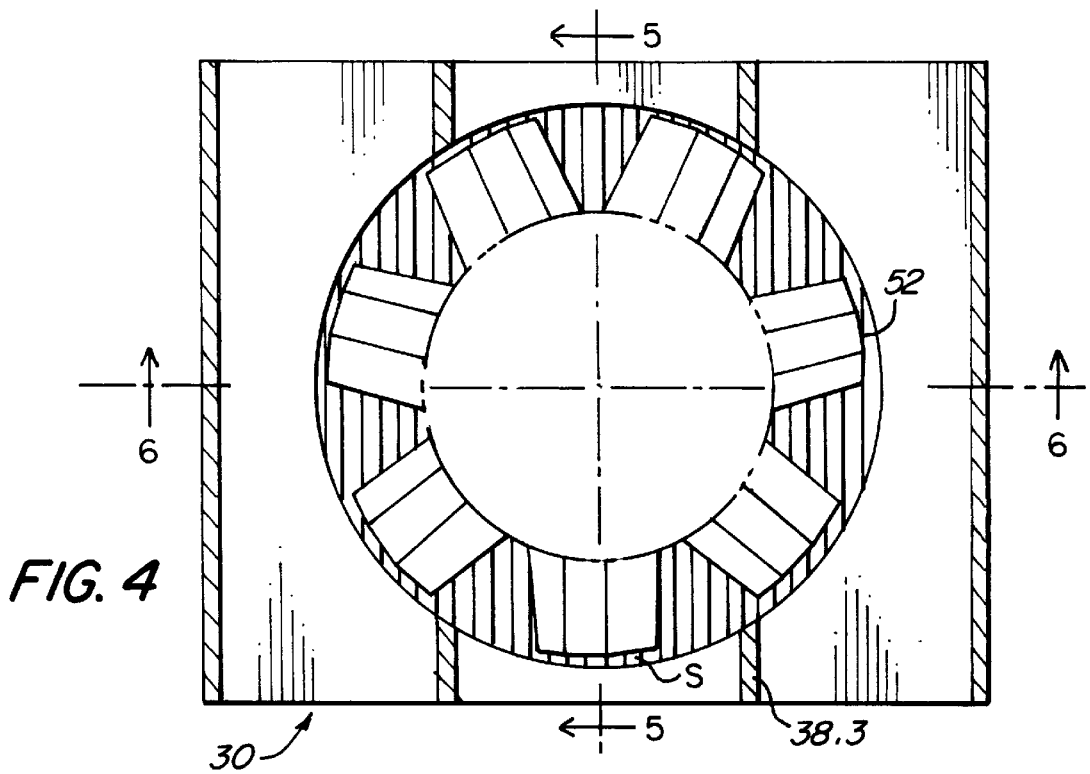
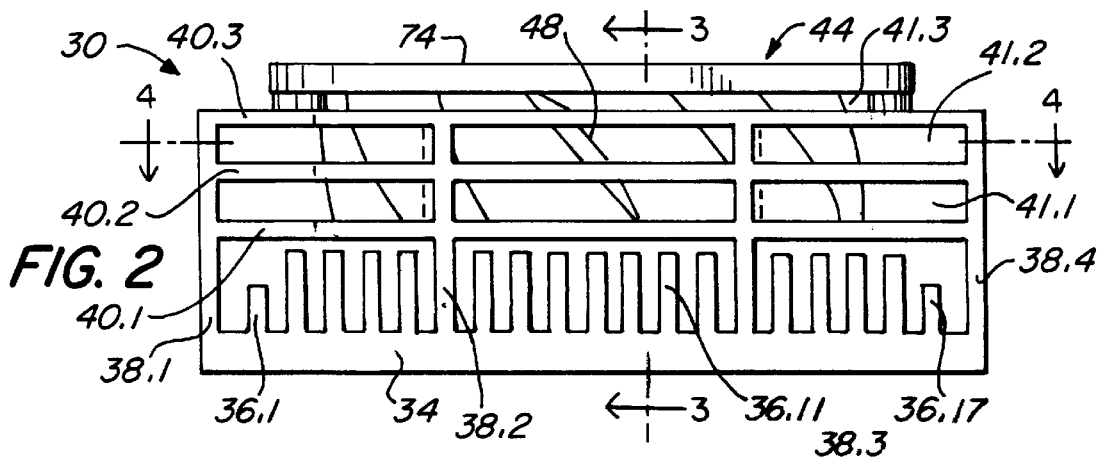
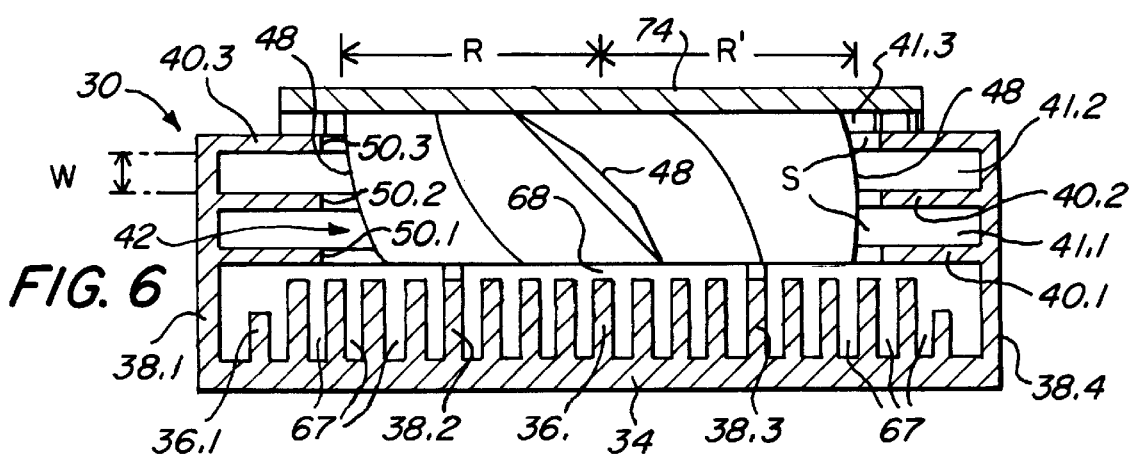

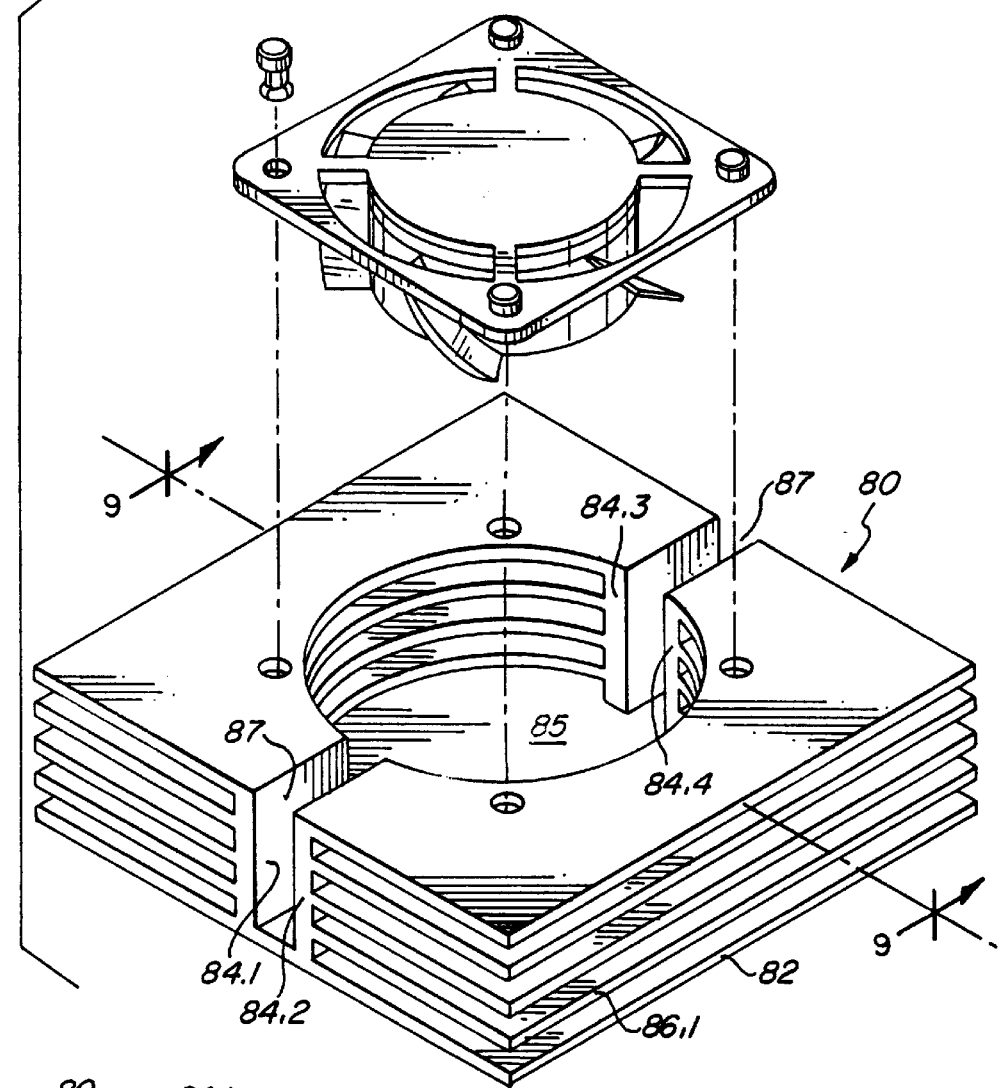
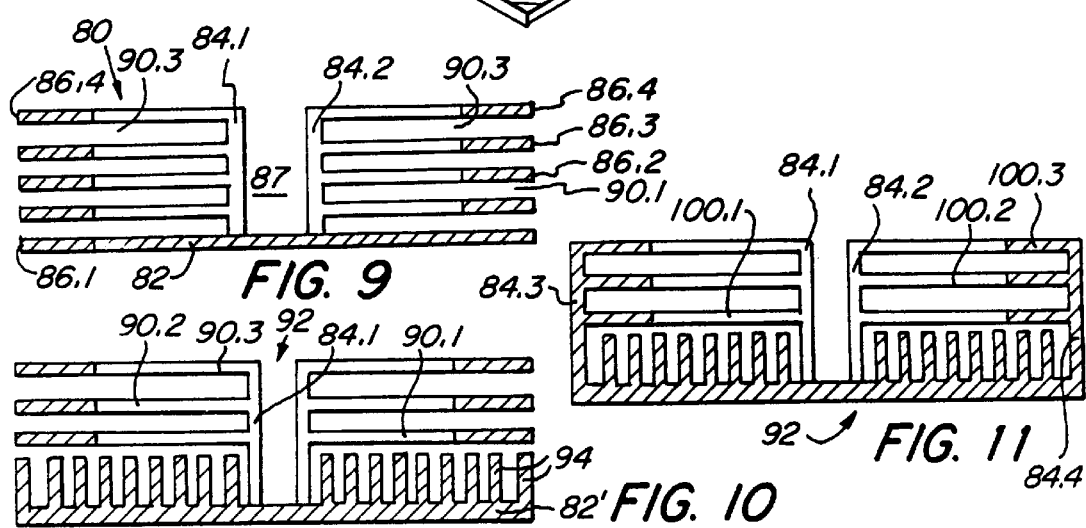

ACTIVE HEAT SINK STRUCTURE WITH FLOW AUGMENTING RINGS AND METHOD FOR REMOVING HEAT

PRIOR APPLICATION

This application claims the benefit of the filing date of Provisional Application Ser. No. 60/012,098 filed Feb. 22, 1996 filed by Andrew I. Lemont all rights to which have been assigned to the same Assignee as for this application.

FIELD OF THE INVENTION

This invention relates to heat sinks generally and more specifically to active heat sinks incorporating a fan for causing an exchange of heat with air flow.

BACKGROUND OF THE INVENTION

Active heat sinks which incorporate fans have been described in the art for use in the cooling of heat generating devices such as electronic components and the like. In U.S. Pat. No. 5,288,203 to Thomas a heat sink is shown and described wherein an axial fan is surrounded by a frame support formed by a heat transfer body having a pressure differential surface formed around the perimeter of the fan blades. The pressure differential surface acts like a duct around the fan blades, and is so shown in some of the Figures. As stated the pressure differential surface provides a low pressure region and an axially displaced high pressure region.

With particular reference to the embodiment shown in FIG. 11 of Thomas, a heat transfer body is shown including a number of vertically displaced rings attached in heat conducting relationship by studs with a circular foundation. The rings are described to constitute an optimized heat transfer surface and their internal edges in effect form an air pressure differential surface. This is obtained by placing the rings in such geometric proximity to each other as to be able to form the air pressure differential surface. Ring spacings of the order of between 0.25 and 1 millimeter are taught with 0.7 mm being preferred. The geometry or shape of the rings are further so made as to enhance the axial pressure differential capacity.

The Thomas ring structure emphasizes the presence of a pressure differential surface and thus the need for the proximity of the Thomas propeller tips to the inner edges of the surrounding rings so as to simulate a duct through which air flow is produced by the fan. Thomas teaches the use of fine spacings between the rings and this both diminishes radial air flow therethrough and the extent to which tip vortices can penetrate into the axial ring spacings.

Although Thomas' tight ring spacings reduce induced radial air flow, his fan structure appears to use a ring cage structure as taught by the U.S. Pat. No. 5,292,088 to H. E. Lemont since the operation of the Thomas device approaches a static air pressure characteristic as demonstrated with curve 52 in FIG. 1A in the '088 patent. The emphasis in Thomas on a need for a pressure differential surface requiring a tight ring-to-ring and propeller-to-ring spacings, indicates a failure by Thomas to recognize the significance of propeller tip vortices in the cooling of a heat sink.

In the US patents to Lemont and owned by the assignee of this invention, namely U.S. Pat. Nos. 5,292,088, 5,393, 197 and 5,470,202, a ring cage structure is described with a flow augmentation structure. With a ring cage structure as described in these patents the tip vortices from an axial fan are converted to useful airflow and additional mass flow arises. This additional flow enters the spacings between the rings and joins the mass flow from the fan. The '088 Lemont Patent teaches the use of a heat exchanger with fan cooling of rings.

Other patents showing a combination of a fan with a heat sink are U.S. Pat. Nos. 5,297,617 and 5,445,215, which show a fan in a duct to take advantage of turbulent air flow; U.S. Pat. No. 5,299,632 and 5,486,980 and 5,494,098 which show a fan integrated with a fin type heat sink; U.S. Pat. No. 5,309,983 and U.S. Pat. No. 5,335,722, which teach a low profile integrated assembly of a fan with the fins of a heat sink for electronic components; U.S. Pat. No. 5,353,863 for a pentium cooling device; U.S. Pat. No. 5,457,342 which in addition to the use of a fan shows a Peltier type cooling device; U.S. Pat. No. 5,475,564 which also shows a hold down device for connecting a heat sink to a CPU; U.S. Pat. No. 5,504,650 and 5,559,674 which illustrate a variety of different combinations of a heat sink and a cooling fan assembly; U.S. Pat. No. 5,526,875 which shows the placement of a fan at the same level as vertically oriented fins of the heat sink; and U.S. Pat. No. 5,535,094, which shows a heat exchange device with a blower assembly and headers to direct the flow therethrough;

The cooling of heat sinks attached to semiconductor chips is becoming more critical as semiconductors and CPUs such as the Pentium chip generate more heat, that typically is attributable to an increase in processing utilization or an increase in complexity. Generally, performance of such chips is affected by temperature increases and exhibit losses of functions of individual components as the operating temperature increases. It is, therefore, important to prevent temperature increases during operation of a semiconductor chip. Heat sinks, whether these operate without or with a fan (an active heat sink) are, therefore, rated for their thermal resistance, i.e. the amount of temperature rise of the heat sink and thus also encountered in the semiconductor device to which the heat sink is connected to, for each watt of dissipated power, expressed as °C./w. Thermal resistance is a function of the volume and surface area in the heat sink so that any comparison of thermal resistances of heat sinks should assume like volumes or take into account any differences.

The effectiveness or heat transfer capability of an active heat sink is a function of the product of the surface area A, the temperature difference between the heat sink and the fluid (air) moving past the heat sink and a heat transfer coefficient $H_c$. The heat transfer coefficient $H_c$ in turn depends upon such factors as the geometry of the fluid flow and its velocity past the heat sink surfaces.

The prior art active heat sinks currently used in the industry generally achieve the same best level of thermal resistance, that typically, for like sized heat sink volumes, is in the range of about 1.4° C./w for Pentium or 486 type chips. The thermal resistance level is to some extent dependent upon the speed of the fan used to remove heat from the heat sink, but by increasing the fan speed noise becomes an objectionable side effect. Hence, fan speed cannot as a practical matter be increased indefinitely. Fans also use power which increases at high fan speeds.

One limitation of prior art active heat sinks lies in the fact that the fan occupies precious space and its housing does not contribute to the heat transfer characteristic of the heat sink. Many concepts have been introduced to add surface area to the heat sink by making the housing thermally conductive and this has some benefits.

What is needed, therefore, is an active heat sink with which thermal resistance for an equivalent heat sink volume can be significantly reduced in a manner that does not require more space, more electrical power and does not introduce more fan noise.

SUMMARY OF THE INVENTION

With a heat sink in accordance with the invention a significant reduction of its thermal resistance is obtained. Thermal resistance levels of the order of about 0.4° C./W and better for heat sinks for typical semiconductor chips can be achieved without requiring more fan power or speed, in an efficiently used space, and with low fan noise.

This is achieved with one embodiment in accordance with the invention by forming the heat sink with a plurality of parallel plates that are supported by one or several heat conducting columns extending from a base plate. The parallel plates are shaped to form flow augmenting rings around a main air flow passage in which a fan is submerged so as to preferentially emphasize and utilize propeller tip vortices and enable these to be incident on radially inward regions, preferably extending into the spacings between the flow augmenting rings for at least up to about one quarter of the radius of the fan propeller. The base plate may or may not have a plurality of fins as is conventional in heat sinks and when used these are located below the flow augmenting rings so that the air mass flow, including induced radial air flow, from the fan passes over and between the fins.

With an active heat sink in accordance with the invention the integration of a fan such as described in the above identified Lemont patents with a heat sink achieves an unexpected result in the cooling of the heat sink. The flow augmenting rings not only conduct heat from the base plate but, because of a scrubbing action by the high velocity tip vortices of significant regions of the internal surfaces of the rings and a relatively large and high velocity induced radial air flow across the flow augmenting rings, an enhanced removal of heat from the heat sink is obtained to an unexpectedly high level. In addition, the destruction of tip vortices provides an additional bonus in that noise from the fan is also significantly reduced.

In one embodiment in accordance with the invention the heat sink is formed of a single metal extrusion which incorporates a base plate, at least one heat conducting column extending from the base plate and flow augmenting plates supported by the heat conducting column. A main air flow passage then needs to be cut into the extrusion with appropriate mounting holes for a fan, i.e. the fan motor and fan blades, designed to work with the flow augmenting plates.

Alternatively a complex structure for a heat sink in accordance with the invention can be formed of a casting or with suitable machining and integrated with a fan to produce an effective low thermal resistance active heat sink.

The chordal dimension of the flow augmenting plates and their spacings from each other along the fan rotational axis are selected to enhance the scrubbing action of the inner regions of the flow augmenting plates by propeller tip vortices. This scrubbing action occurs at substantial greater velocities than induced radial airflow so that the inner plate regions on which these vortices are incident exhibit heat transfer coefficients that are an order of magnitude greater than those attributable to other regions of the heat sink. By preferentially emphasizing and using tip vortices their contribution to heat removal is a major component in the overall heat transfer coefficient of the heat sink structure. Hence, the average overall heat transfer coefficient $H_c$ of the heat sink can be at least 50 watts/m²/°C. and typically is in the range of 100 watts/m²/°C.

A conventional fan experiences a loss in air flow directly related to the square of the pressure loss due to aerodynamic inefficiencies such as from stall and friction. With a heat sink in accordance with the invention, the additional heat transfer surface area provided by the flow augmenting rings is free from these types of losses. This results in a fan-heat sink thermal resistance that can be substantially below conventional active heat sinks as well as below 0.4° C./W, instead of about 1.4° C./W, for typically sized heat sinks for semiconductor chips such as the Pentium or 486 chips.

Additional benefits of a heat sink in accordance with the invention are acoustic noise reductions due to the elimination of tip noise, a bearing life improvement because the fan can operate at lower speeds to produce at least equivalent heat transfer of prior art devices, a low profile design with the fan submerged within the heat sink and an ease in the manufacturing by use of a number of different methods whether these involve extrusions, castings or stamped assemblies.

Different configurations can be used with an active heat sink in accordance with the invention. For example, the column used to place the flow augmenting plates in heat conducting relationship with the base plate can be formed of thermoelectric cooling devices or a heat pipe which improve the transfer of heat from the base plate to the flow augmenting plates. The extrusion can be so shaped that either none or a few floating dies can be used. The flow augmenting rings or plates can be directly supported from the base plate so as to enhance the removal of heat with an axial fan that is oriented to move air parallel to the base plate. Bonded folded fins can be employed between the flow augmenting plates to increase the heat sink surface area and provide a plate support structure without the use of columns. The flow augmenting plates can be made of a single folded strip of metal.

It is, therefore, an object of the invention to provide an apparatus and method for significantly improving the removal of heat from a semiconductor chip and other heat generating devices. It is a further object of the invention to provide a method for the removal of heat from a heat generating device with an active heat sink while also reducing noise, and improve bearing life of the fan.

These and other objects and advantages of the invention can be understood from the following detailed description of several embodiments in accordance with the invention described in conjunction with the drawings.

BRIEF DESCRIPTION OF THE DRAWINGS

The file of this patent application contains two sheets of color photographs and two sheets of black and white photographs. Copies of this patent with color drawings will be provided by the Patent and Trademark Office upon request and payment of the necessary fee.

FIG. 1 is a perspective view of one heat sink in accordance with the invention;

FIG. 2 is an end view of the heat sink as shown in FIG. 1;

FIG. 3 is a partial enlarged section view of the heat sink shown in FIG. 1 taken along the line 3—3 in FIG. 2;

FIG. 4 is a section view of the heat sink taken along the line 4—4 in FIG. 2;

FIG. 5 is a section view taken along the line 5—5 in FIG. 4 of the heat sink of FIG. 1;

FIG. 6 is a section view taken along the line 6—6 of the heat sink shown in FIG. 4;

FIGS. 7C' and 7D' are respectively identical photos shown in FIGS. 7C and 7D but in color;

FIG. 8 is a perspective and exploded view of another heat sink in accordance with the invention;

FIG. 9 is a section view of the heat sink shown in FIG. 8 and taken along the line 9—9 in FIG. 8;

FIG. 10 is a similar section view as FIG. 9 for another but similar heat sink as shown in FIG. 8;

FIG. 11 is a similar section view as in FIG. 9 for a another but similar heat sink as shown in FIG. 8;

DETAILED DESCRIPTION OF THE DRAWINGS

Figure 7A:
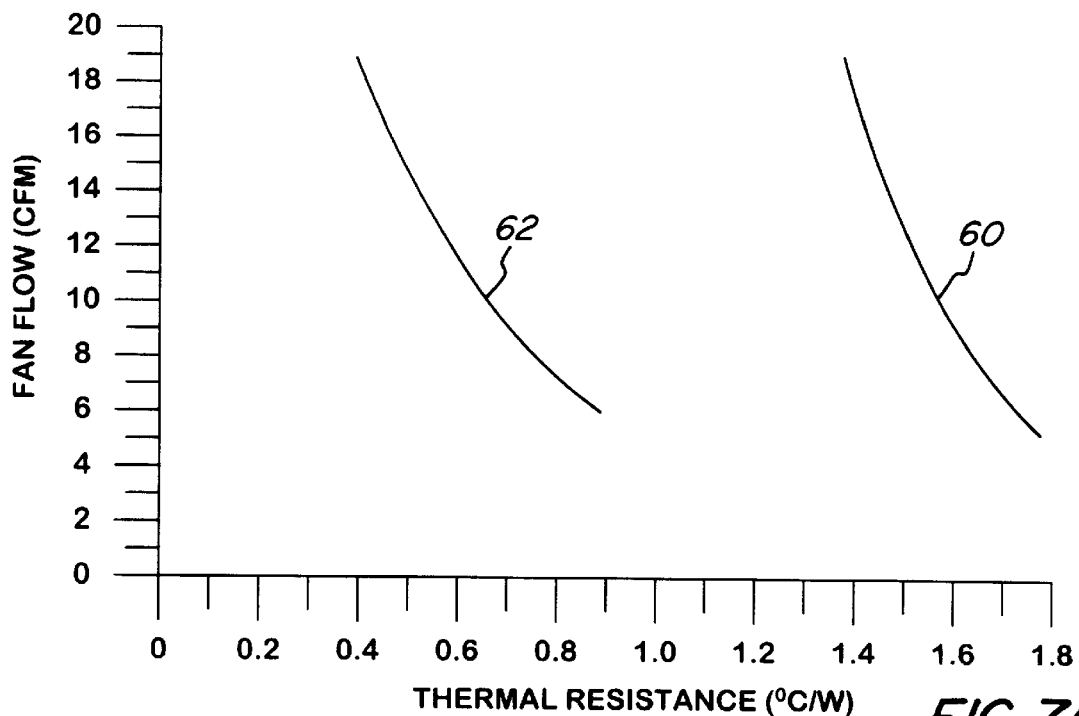
FIG. 7A is a plot of performance curves of thermal resistance as a function of fan air flow for a prior art heat sink and a heat sink in accordance with the invention.

With reference to FIGS. 1–6 a heat sink 30 in accordance with the invention is shown. The heat sink 30 is formed of copper or an extruded material such as aluminum, though the invention is not limited to this type of material and other materials and techniques for its manufacture can be used such as stamped pieces that are brazed together or by casting or with machining techniques. The heat sink 30 is designed for use in the removal of heat from a semiconductor device 32 though its use can be applied to other heat generating devices.

The heat sink 30 has a base plate 34 for heat conducting contact with the outer surface of the chip device 32 and a plurality of parallel elongate fins 36.1–36.17 extending along the width of the heat sink. The base plate is shown as a flat plate though it is to be understood that other shapes can be used such as a column coupled in heat conducting relationship with the heat generating device. The base plate 34 has elongate straight columns 38 extending upwardly to support cross plates 40 which form flow augmenting rings having the effects as shown and described in the aforementioned Lemont patents. The flow augmenting plates 40 are axially separated from each other by spaces or air flow pumping apertures 41.

The use herein of numerals after a decimal point identifies specific items while the numeral before the decimal point refers to the same type of item in a more general way.

The columns 38 are elongate substantially solid plate walls, though they could be perforated or discrete columns, which extend up from base plate 34 and support the flow augmenting plates 40 to conduct heat to the plates 40. End located heat columns 38.1 and 38.4 provide additional heat transfer capability though, because of their solidity, they close off portions of the radial ends of the air pumping spaces 41. A central cylindrical cavity 42 is formed into the extruded heat sink 30 to receive an axial fan 44 including its motor 46. The fan 44 has propeller blades 48 which extend towards the radially inward edges 50 of the flow augmenting plates 40.

The heat sink 30 is so designed that its flow augmenting plates or rings 40, their separations W or 41 and the clearances S between the rings and the tips 52 of the propellers 46 provide the flow augmentation as described in the aforementioned Lemont patents. Hence, the 5,292,088 and 5,393,197 Lemont patents are incorporated herein by reference thereto, though it is to be understood from the following description that variations from the parameters and embodiments described in these patents are made to enable the heat sink of this invention to work in an optimum manner, whether this is for performance or for cost reduction.

The effect of the flow augmentation plates 40 is to introduce a flow pattern as illustrated in FIGS. 3 and 5. This includes a main axial mass flow indicated by arrows 56 and an induced additional useful mass flow indicated by arrows 58 obtained from a disturbance of the tip vortices 59 from the propeller blades 46. The additional mass flow is directed in a radial direction between and over the flow augmenting plates 40. The tip vortices 59 and this radial inward flow and a radial outward discharge flow have a significant velocity and as a result have a dramatic impact on the cooling of the flow augmenting plates 40 and thus the performance of the heat sink 30.

Figure 7B:
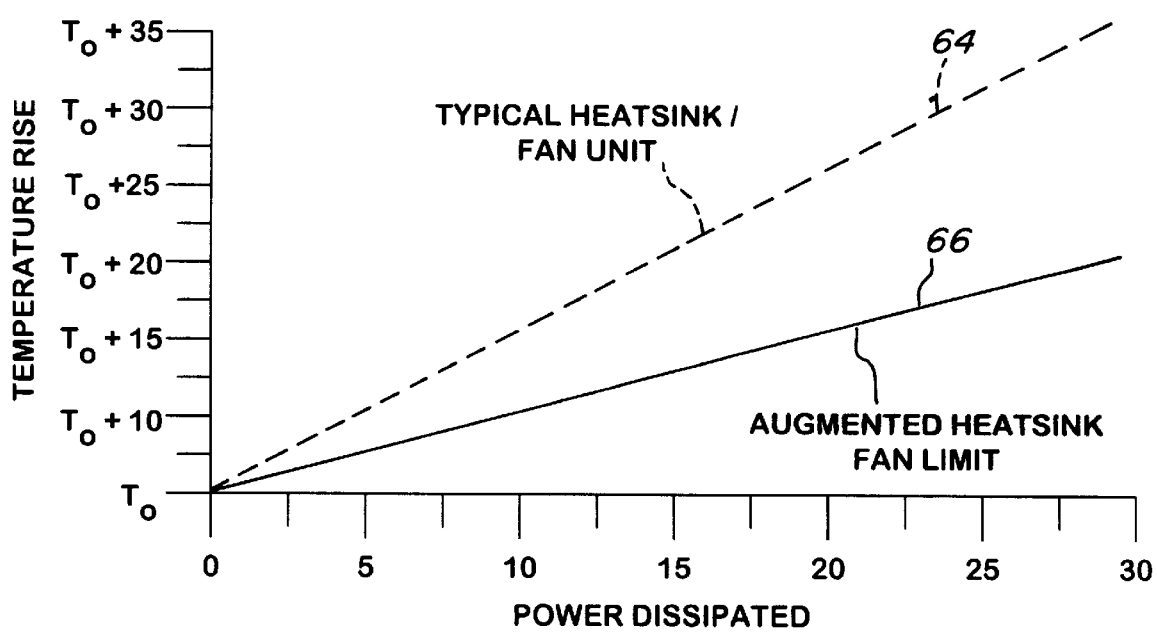
FIG. 7B is another plot of performance curves of temperature rises as a function of power dissipated for a conventional heat sink and one in accordance with the invention.
Figure 7C:
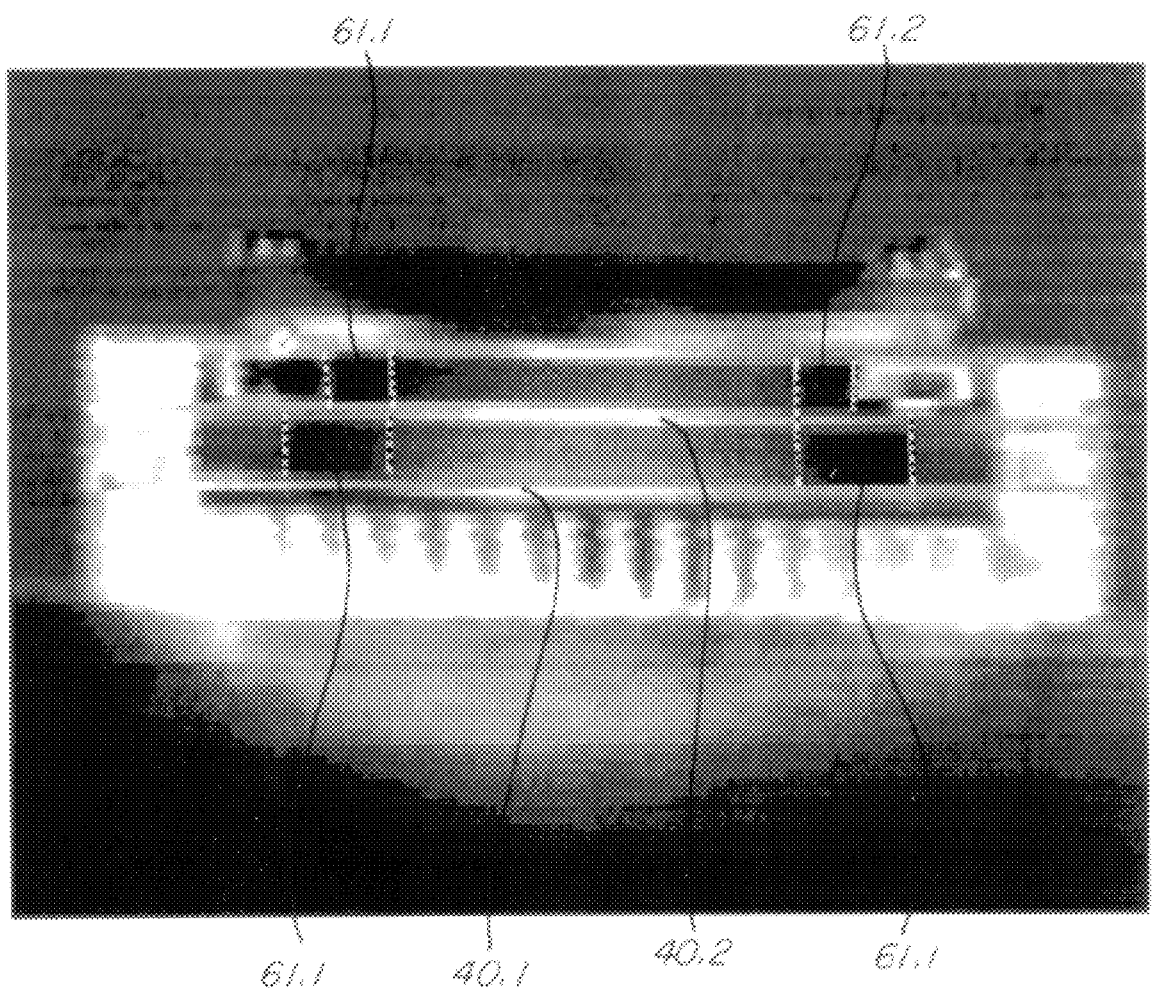
FIG. 7C is a thermal photo, in gray scale, illustrating in a side view in elevation with colors the temperature and temperature gradients in an operative active heat sink in accordance with the invention.
Figure 7C:
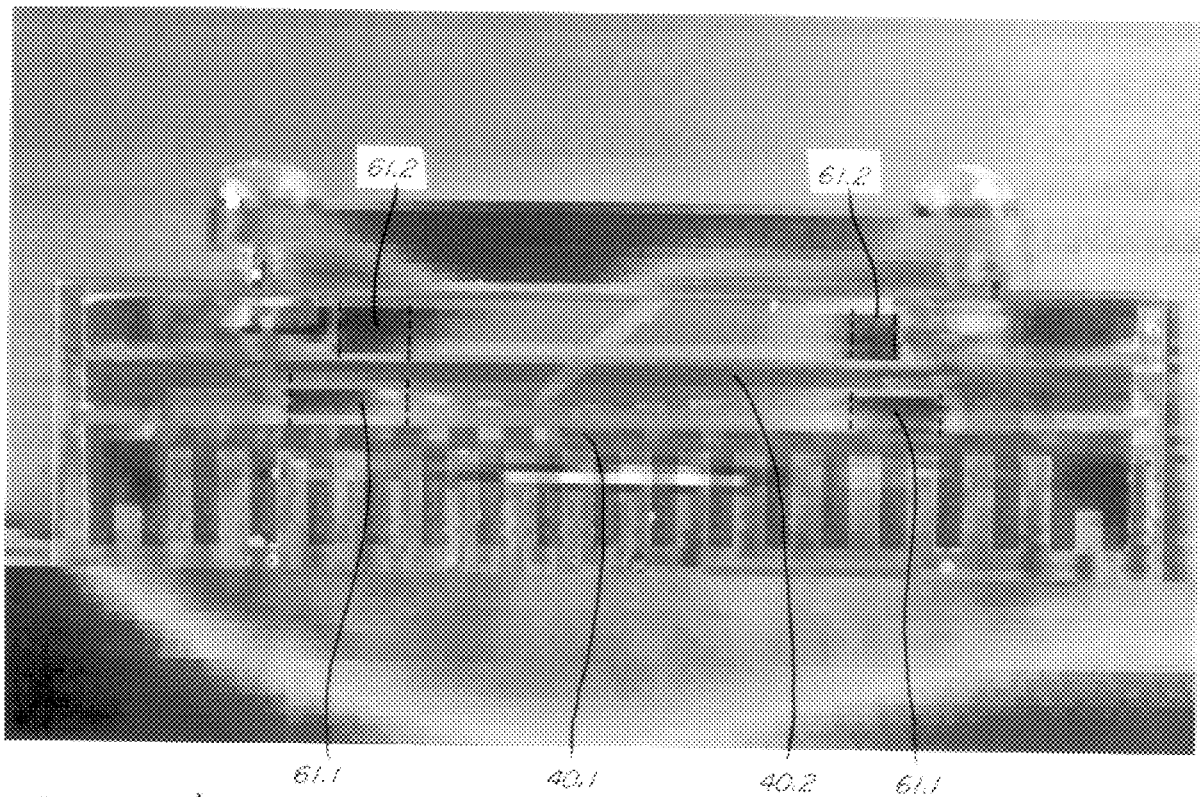
Figure 7D:
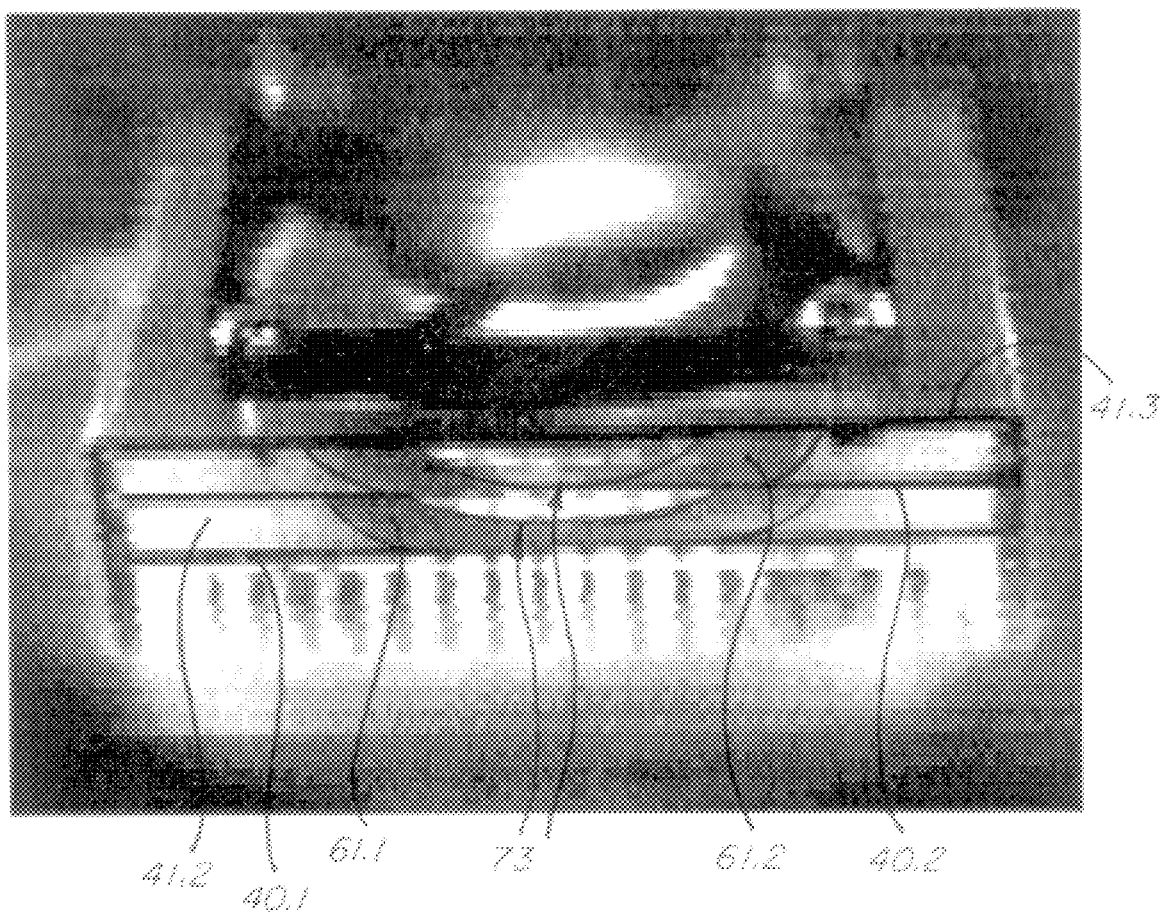
FIG. 7D is a thermal photo, in gray scale, of the same active heat sink of FIG. 7C but taken at a about a 45° angle relative to the horizontal along the same view as in FIG. 7C and resulting in a perspective thermal view of the heat sink.
Figure 7D:
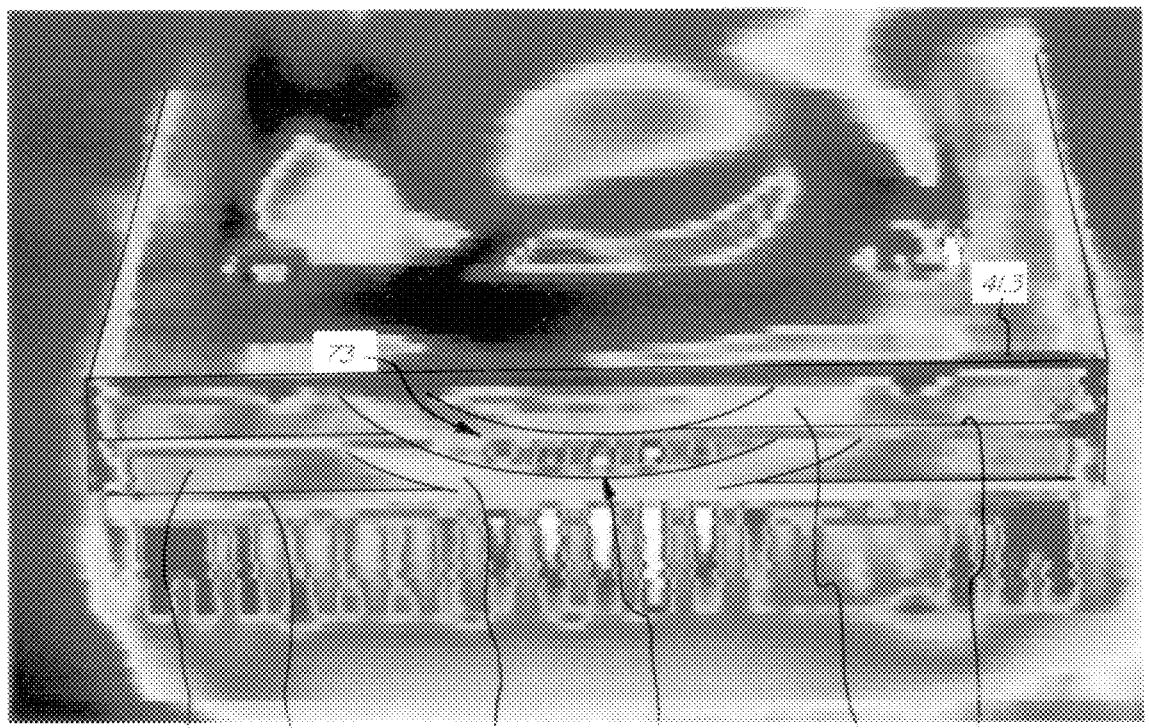
Figure 12:
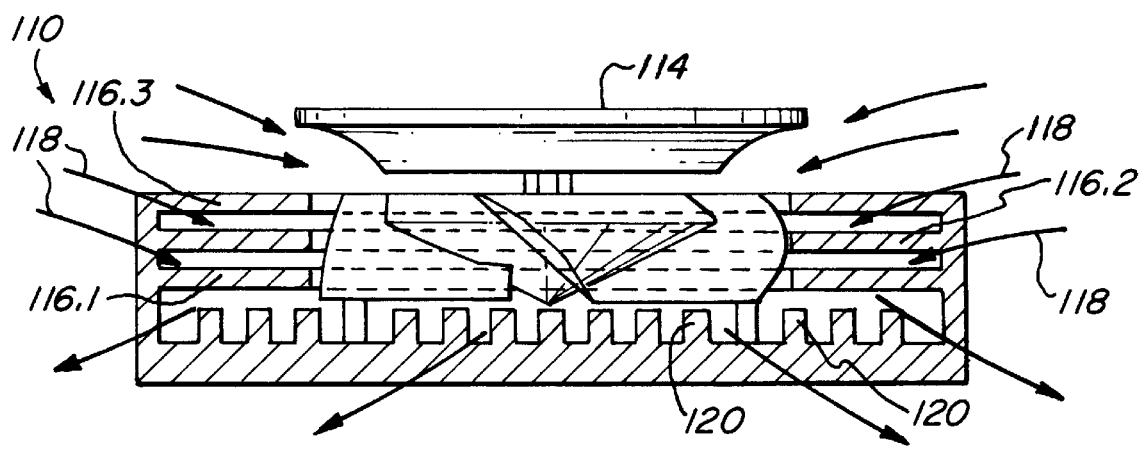
FIG. 12 is a side section view of a another heat sink particularly insensitive to axially adjacent obstacles in the path of the airflow.

FIGS. 7C and 7D are thermal gray scale photographs of a heat sink in accordance with the invention wherein the lighter grey or white areas represent a hotter region than the darker areas with gray levels therebetween representing in-between temperatures. FIG. 7C' and 7D' are exactly the same photos but in color where blue represents cooler regions and deep red the hottest regions. The full scale of the temperature range may be of the order of say 7° C. The particular heat sink is of the type as shown in FIGS. 1–6 without the middle columns 38.2 and 38.3 or that as shown in FIG. 12 without the deflector on the fan. The heat sink in FIGS. 7C and 7D and 7C' and 7D' is subjected to a heat load of some 30 watts below the base plate.

Of particular interest is the appearance of annular cooled regions 61.1 and 61.2 of and above the radially inner portions of the flow augmenting plates 40.1 and 40.2. These regions show a radial temperature gradient because they are primarily cooled by the impact of tip vortices such as 59, see FIG. 3, and which are able to penetrate into the flow augmenting apertures 41.1 and 41.2 to air-scrub the radially inner plate regions. The view in FIGS. 7C and 7C' shows that the cooled regions 61.1 and 61.2 penetrate the apertures 41 to the extent of about half the ring chord width at its widest point and at least the full ring chord at its smallest width as shown at 73 in FIGS. 7D and 7D'. This penetration is about 25% of the propeller radius R or main air flow passage radius R'.

The heat transfer coefficient in the tip-cooled ring regions 61, inclusive of contributions from induced radial flow, typically exceeds at least about 75 to about 100 W/m$^2$/°C. In contrast, the heat transfer coefficient for other heat sink regions is predominantly determined by induced radial air flow between parallel plates and is of the order of about 7 W/m$^2$/°C due to a lower air velocity. This explains the significance of the tip vortices on the cooling of the heat sink as illustrated in FIGS. 7C and 7D.

FIG. 7A shows two curves 60 and 62 of thermal resistance of heat sinks measured in °C./Watt as a function of fan flow in CFM, cubic feet per minute. Curve 60 is demonstrative of the thermal resistance of a typical prior art active heat sink wherein the best performance at 20 CFM is about 1.4° C./W. Curve 62 shows a thermal resistance obtained with a heat sink 30 in accordance with the invention and of comparable size and surface area as the prior art heat sink and fan and exhibits a thermal resistance of about 0.4° C./W, an improvement by a factor of more than 3. It is expected that an even greater improvement in heat sink performance can be achieved.

The ability of an active heat sink to remove heat is a function of the surface area, i.e. the total volume, exposed to the heat removing air, the temperature difference between the surface and air medium and a heat transfer coefficient $H_c$. The heat transfer coefficient $H_c$ is a function of the velocity of the heat removing fluid, and the characteristics, such as surface roughness, smoothness or undulations of adjacent ring surfaces and the geometry of the fluid flow. The higher the velocity of the air flow the more heat can be removed and thus the lower the thermal resistance of the heat sink.

The improved reduction in thermal resistance of a heat sink in accordance with the invention is primarily attributable to the combined effect of the radial air flows obtained over the flow augmenting rings which are in heat conducting relationship with the base plate 34 and the penetration of propeller tip vortices into the pumping apertures 41 between the rings 40. The radial flow represents a significant portion of the total mass flow, at least about 20% and frequently about 30%, and has a sufficient velocity, typically about 300 feet per minute, sa as to contribute to the overall high heat transfer coefficient of the heat sink structure. The tip vortices provide a dominant cooling effect by virtue of their high velocities and ability to penetrate into the spacings between the rings 40. A heat transfer coefficient in the range from about 50 and usually above about 75 and more than 100 watts/m$^2$/°C. and more can be obtained.

FIG. 7B is illustrative of the effect of the heat sink 30 in accordance with the invention. At 64 is a plot of the power dissipated and the resulting temperature rise typically encountered with a conventional prior art active heat sink. At 66 is a similar plot for an active heat sink using flow augmenting rings and fan of the same size. The temperature rise is significantly lower with the heat sink of the invention.

The discharge end of the main passage way 42 delivers the combined main and induced air flows to the fins 36 where the back pressure forces air flow to exit through spaces 67 between the fins and between the fins and a column 38 and the available clearance 68 above the fins 36 and the flow augmenting ring 40.1. Some air is forced to discharge radially outwardly through the aperture 41.1 between flow augmenting rings 40.1 and 40.2 as illustrated with arrows 70 in FIGS. 1–3. The cooling effect of these air flows past the flow augmenting rings is dramatic as illustrated by the above described performance curves in FIGS. 7A and 7B and the thermal photos in FIGS. 7C, 7D.

The flow augmenting plates 40 are so placed with respect to the tips 52 of the propeller blades that their tip vortices can brush the internal surfaces of the flow augmenting rings with high velocity air flows and are sufficiently disturbed so that an induced radial flow can ensue. This flow is sufficient to enable an effective cooling of the rings 40.

The spacing S between the propeller blade tips 52 and the inner edges 50 of the rings 40 is one of the factors used to accomplish this. Typically this gap S is in the range from about 2.0% to about 10% of the radius R of the propeller blades for purposes of optimum flow enhancement, though when heat transfer is emphasized the gap S can be in the range from about 5% to about 15% of the radius R. The spacing S should not be so large as to allow a reverse flow. Hence, for very large fans having a radius of the order of more than 30 inches the gap S tends to go below 5% and when limited to about a half an inch tends to go to about 2% though care should be taken that the spacing S is not too small lest the tip vortices are substantially suppressed and the beneficial effect from the propeller tip vortices is not achieved.

The views in FIGS. 3 and 5 and other require that the spacing S appears as varying in size from ring to ring. It should be understood, however, that in practice, the tips 52 are shaped so that their circle of revolution during rotation follows a cylindrical surface whereby the spacing S is effectively constant along the axial spans of the propeller blades 48.

The sizing and shaping of the flow augmenting rings 40 influences the radial air flows. Their preferred shape for flow augmentation is cylindrical, though that can not always be practical. As described and shown with reference to FIG. 16 in the Lemont '197 patent the rings can be rectangular in sections and not necessarily annular in shape. In case of other than annular shapes the pumping action from the apertures 41 can still be obtained by staying within key parameters. Thus the flow augmenting rings 40 can be of diverse shapes and also be effectively segmented as shown in FIGS. 1–6 where the outer columns 38.1 and 38.4 prevent radial flow. Since the object of the rings is to provide heat dissipating surfaces, making them other than circular sections such as rectangular, provides more surface area and still effectively retain the heat sink function of the invention.

The flow augmenting rings are typically relatively thin structures whose average radial width (outer radius less inner radius) or chord, C, and axial spacings W are selected to enhance the flow augmentation. In case of rectangular rings 40 as shown in FIG. 4 the ring chord dimension C varies around the perimeter and thus an average value (the largest radial width summed with the least width and then divided by two) is used. Generally if the ring chord C is too large the augmentation effect is diminished, though the larger surface area provides more heat removal ability with the available turbulent type air flow through the adjacent aperture 41. If the ring chord dimension is made too small the flow augmentation effect and the heat transfer capability are diminished.

The size of the ring chord C can be expressed as a function of the fan radius R or the main flow passage radius R', see FIG. 6, The radius R' is typically no more than from about 2.5% to about 15% larger than the fan radius R with 5% being typically used and with the lower range usually applicable to large diameter fans. Hence, C should be in the range from about 10 to about 50% of the fan radius R or main flow passage radius R'.

The flow augmenting rings 40 thicknesses t typically should be in the range from about 0.1 to about 0.4 of the average chordal dimension C.

The ring axial spacings W should be in the range from about 5% and 50% of the average ring chord C as long as the separation between axially adjacent flow augmenting rings 40 is not so small that induced radial air flow through the aperture 41 is inhibited and the tip vortices cannot penetrate the axial spacings between the rings.

This means that for smaller heat sinks, having a main air flow passage of 40 mm diameter (a radius of 20 mm), the axial width W becomes a greater percentage of the average ring chord C or about 60% of C and thus preferably at least above about three mm. At smaller separations W the radial flow tends to be choked off and the ability of the tip vortices to penetrate into the axial spacings between the rings is reduced. In such case the advantages of the invention are diminished until the spacing W becomes so small that the benefits of the invention are suppressed. A diminishment of the benefits of the invention also occurs when the axial widths W between the rings 40 are made too large.

In general, a preferred and optimum geometry for an active heat sink in accordance with the invention would involve a fan outer radius R, a main air flow passage radius R' of about 1.03 R, a ring chord C of 0.25 R, a ring thickness t of 0.3 C for small heat sinks and 0.12 C for larger units and a ring spacing W of 0.75 C.

The aperture 41.3 is formed by spacing the back mounting plate 74 of the fan 44 away from the upper flow augmenting ring 40.3. Since the spacing W is of the order of 3 mm in a small heat sink the additional space occupied by this is negligible.

With reference to FIGS. 8–11 other embodiments for the type of heat sink as shown in FIG. 1 are illustrated. In FIGS. 8 and 9 a heat sink 80 is shown that is preferably also made with a metal extrusion process but does not require a floating die. Other techniques for making the heat sink 80 can be used such as by casting or with a hot wire process or assembled with previously stamped parts. The heat sink 80 has a base plate 82 for contact with a heat generating device. Columns 84.1, 84.2, 84.3 and 84.4 extend up from the base plate 82 and support a plurality of flow augmenting rings 86 which extend radially outward in cantilever fashion parallel with the base plate 82.

When extruded the heat sink 80 has elongate walls extending across the base plate 82 with columns 84.1, 84.3 and 84.2, 84.3 respectively in alignment with each other. Then when the main air passage 85 is cut into the extrusion the elongate walls become heat conducting columns 84 located at the periphery and end portions of the base plate 82. The columns 84 are laterally spaced from each other by gaps 87 which receive attachment clips for heat coupling to a semiconductor chip and to enable extrusion of the structure without the use of floating dies. The columns 84 further are preferably placed, as measured along at least one dimension, near the central region of the base plate. The columns 84 are sufficiently thick so as to be able to transfer all the heat from the base plate 82 to the flow augmenting rings 86.

The main air flow passage way 85 is formed in the heat sink 80 and sized to receive a fan 88. The fins usually employed on the base plate 82 can be dispensed with as illustrated in FIGS. 8 and 9 though they are included in a similar design shown in FIG. 10. Additional heat transfer capability in place of fins is provided by the lower flow augmenting ring 86.1. The apertures 90 between the rings 86 are not obstructed by end located columns 84 as in the embodiment of FIGS. 1–6 so that the rings extend radially outwardly in cantilever fashion from the columns 84. In this manner additional radial air flow can pass through the apertures 90.

In FIG. 10 a heat sink 92 is shown similar in shape to that shown in FIG. 8 but with the lower ring segments 90.1 removed and fins 94 employed on the base plate 82'. In FIG. 11 a heat sink 98 similar to that shown in FIG. 10 is shown, but in this case additional columns 84 are employed on lateral ends of the flow augmenting rings 100 similar to the construction of the heat sink of FIG. 1.

In an alternate embodiment, similar to that shown in FIGS. 8 and 9, the column pairs 84.1, 84.2 and 84.3, 84.4 are joined by metal instead of an air gap 87. This provides thicker columns 84 on respectively opposite sides of the main air flow passage 85 and assures sufficient heat conduction capability from the base plate 82 to the flow augmenting rings 86. In such case an alternate clamping device is used to hold the base plate against a semiconductor device 32.

The dimensional relationships previously described for FIGS. 1–6 are also applicable to the embodiments shown in FIGS. 8–11.

Figure 14:
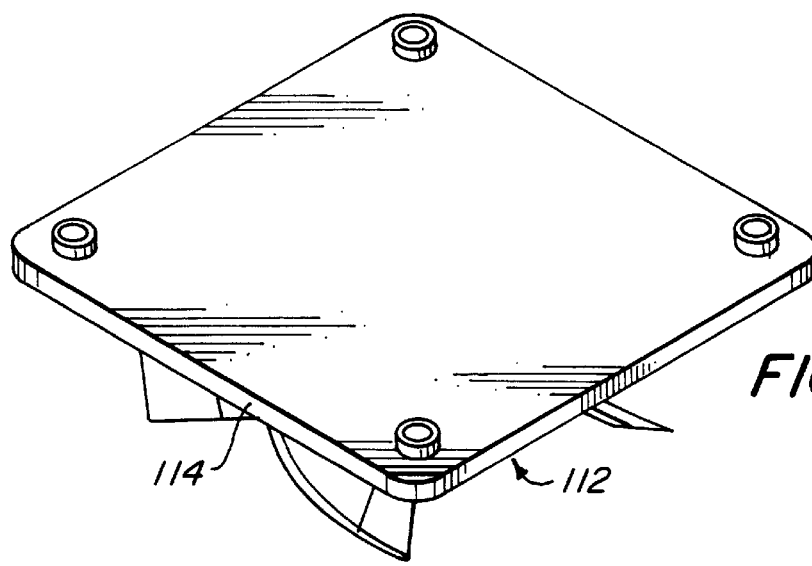
FIGS. 13 and 14 are respectively side and perspective views of a fan used in the heat sink shown in FIG. 10.
Figure 13:
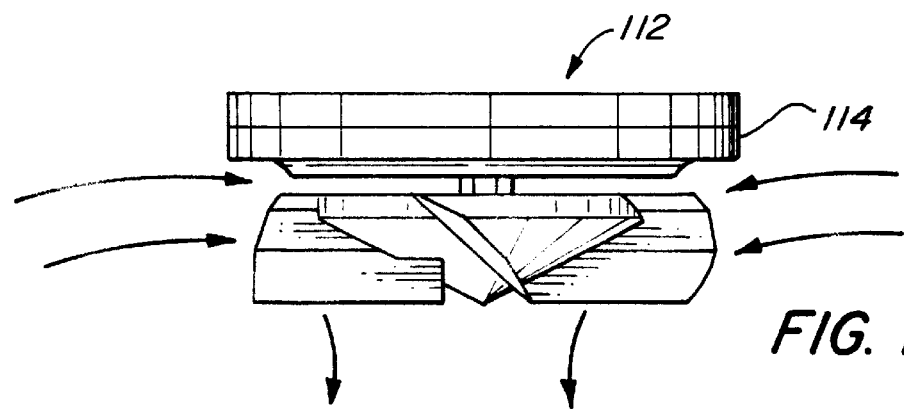

With reference to FIGS. 12–14 a heat sink 110 is shown wherein a fan 112 is provided with a deflector 114 to pull incoming air flow from the sides and thus be less sensitive to objects located directly above the heat sink 110 over the fan 112. The heat sink, which is similar to that as shown in FIG. 1, has flow augmenting rings 116 separated by spaces sufficient to enable induced air flow as suggested by arrows 118. The main air flow is discharged through the spaces between the fins 120.

The active heat sink 110 is shown with a deflector 114. The heat removing capability of the heat sink is, however, not significantly degraded when the axial intake of the fan is blocked by electronic components or the like, since the availability of radial inflow of air prevents the fan from stalling.

Figure 15:
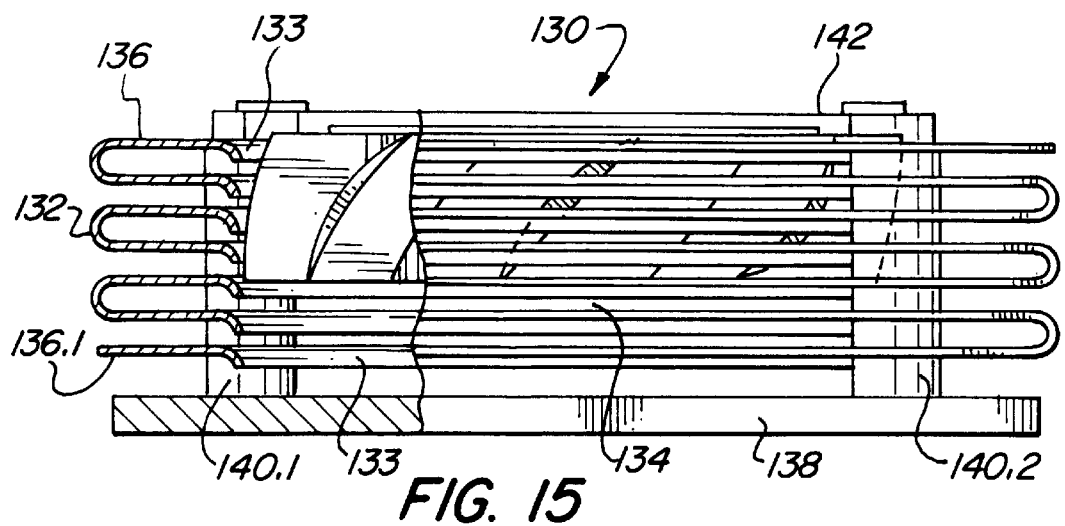
FIG. 15 is a side view in partial section of another heat sink in accordance with the invention wherein the flow augmenting rings are formed of a single multi-folded strip of material.
Figure 16:
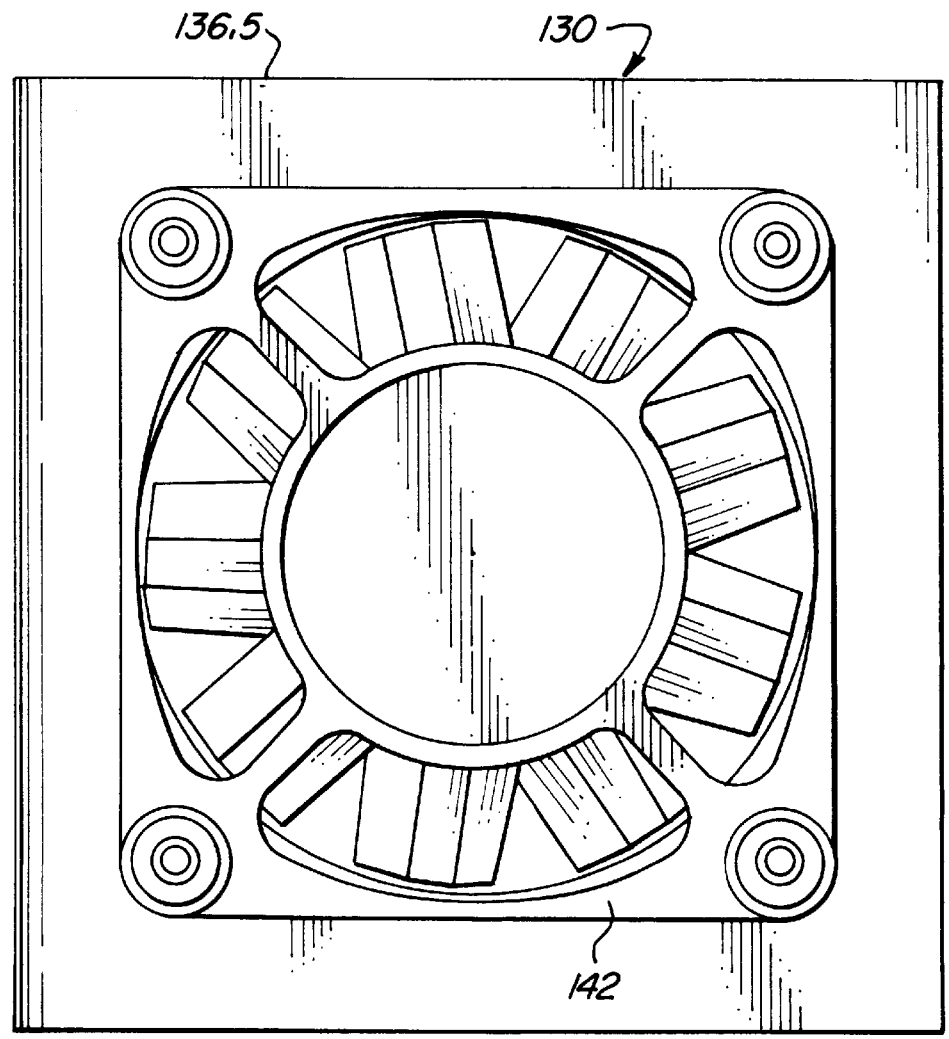
FIG. 16 is a top plan view of the heat sink of FIG. 15.

In FIGS. 15 and 16 a heat sink 130 is shown formed of a single multi folded strip of heat conducting material 132. The strip 132 typically is first appropriately stamped to cut out apertures 133 that have the cross-sectional dimension of the intended main air flow passage 134 and are so located that when the strip 132 is folded to form flow augmenting rings 136 the apertures 133 align and the axial spacings W between the rings 136 is as required. The strip 132 is further so shaped to provide the rectangular surface areas for the individual flow augmenting rings 136 as illustrated in FIG. 16.

Initial testing of an undersized bread board type model indicates that the thermal resistance of a heat sink 130 comparable in size to the type shown in and described with reference to FIG. 1 is likely to be well below 0.4° C./W.

A base plate 138 is provided with suitable heat conducting columns 140. The columns 140 can be of solid metal or formed of heat pipes and serve to conduct the heat from the base plate 138 as well as support the flow augmenting rings 136. The attachment of the columns to the rings 136 can be by way of brazing or such other fastening technique enabling good heat conduction from the columns 140 to the flow augmenting rings 136. The fan 142 can be attached to the structure with suitable screws applied to threaded holes in the columns 140 or with other techniques such as staking or riveting.

Figures 17, 18:
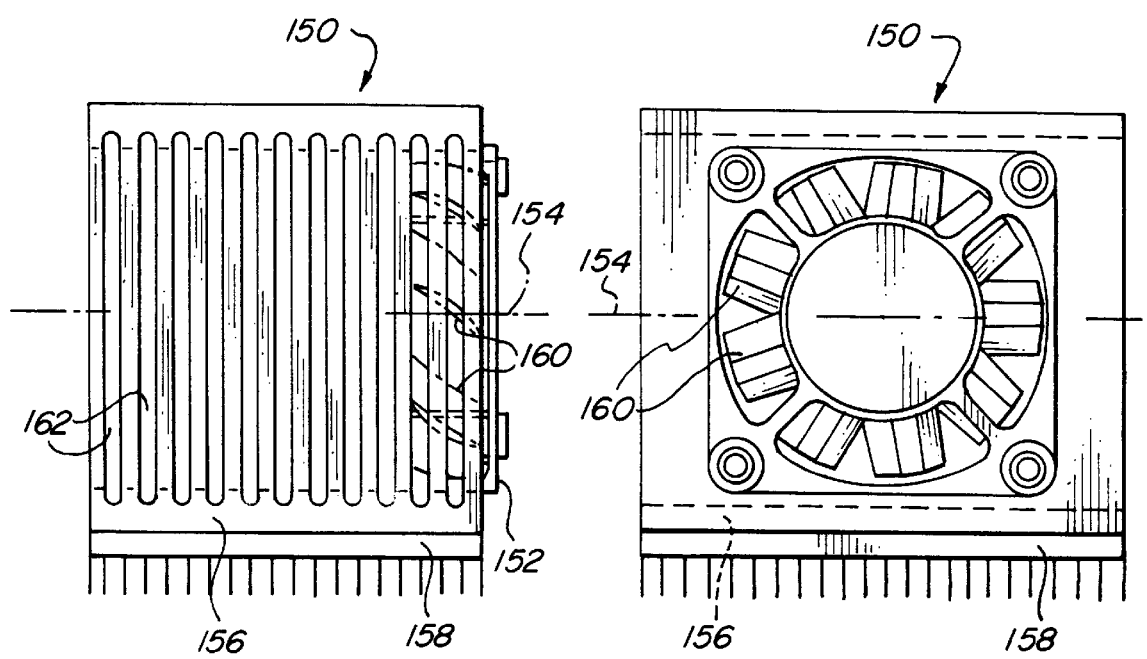
FIG. 17 is a side view in elevation of a heat sink in accordance with the invention wherein the fan is supported in a vertical orientation.
FIG. 18 is a side view of the heat sink shown in FIG. 17 and taken along the axis of the fan.

FIGS. 17 and 18 show an embodiment wherein a heat sink 150 is mounted so that the fan 152 mounted thereto has its rotational axis 154 horizontal or parallel to the base plate 156 mounted to the electronic chip 158. The heat sink now is formed with a plurality of flow augmenting rings not all of which are within the axial span of the fan blades 160. The flow augmenting rings are each affixed to the base plate 156 and are supported by it so that heat conducting and ring support columns are not needed. The last ring can be either open or closed since its axial distance from the fan enables a sufficient amount of air to radially spill out from the apertures 162 between the rings. The spacings 162 at the upper end may be open or closed.

Figure 19:
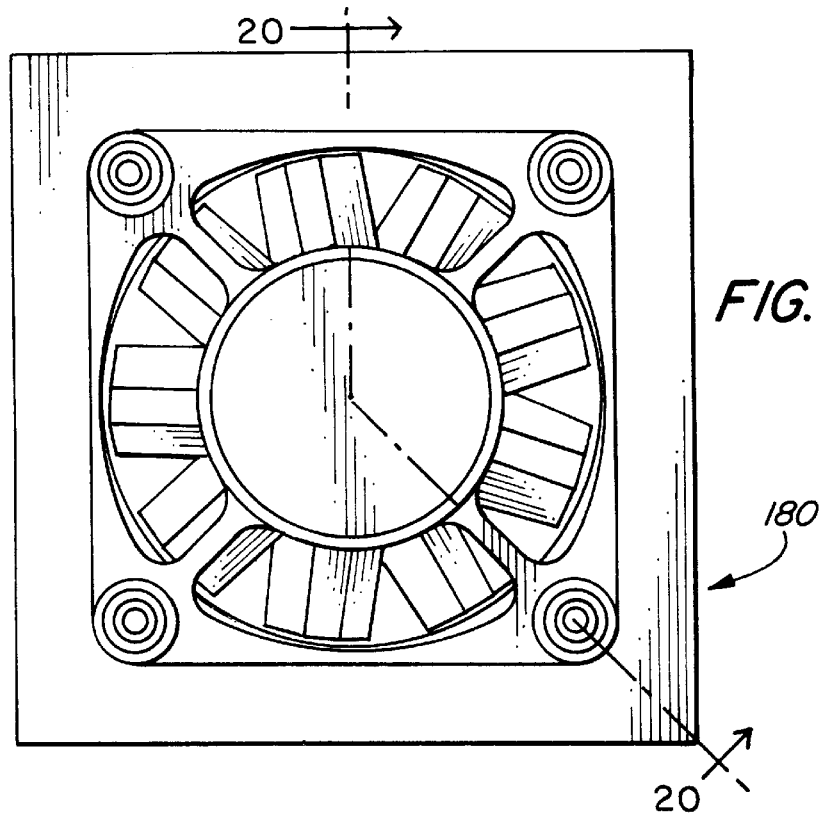
FIG. 19 is a top plan view of a heat sink in accordance with the invention wherein heat pipes are employed to convey heat from a base plate to flow augmenting rings.
Figure 20:
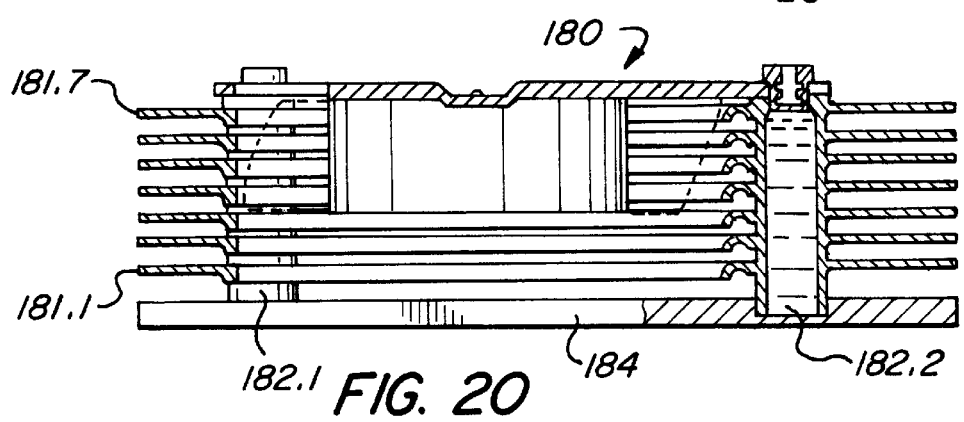
FIG. 20 is a section view taken along the line 20—20 in FIG. 19.
Figure 21:
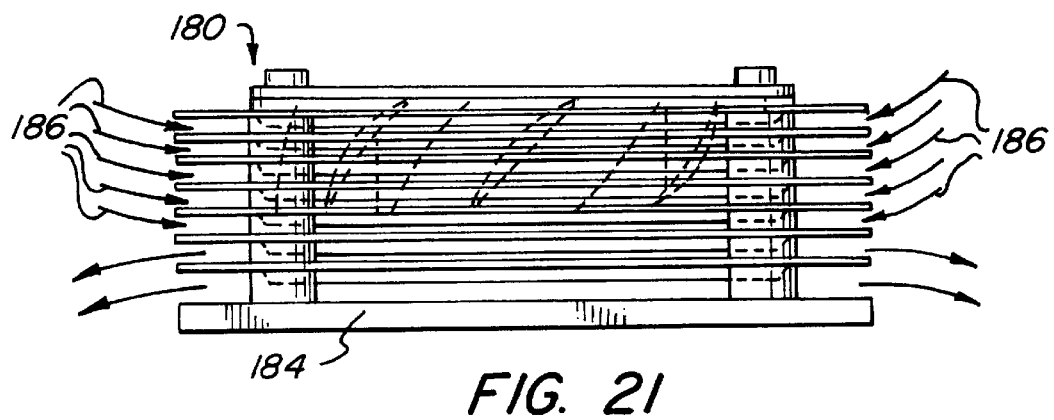
FIG. 21 is a front view of the heat sink of FIG. 19.

FIGS. 19–21 show a heat sink 180 wherein a plurality of flow augmenting rings 181 attached to and supported by columns which can be either thermoelectric cooling columns or heat pipes 182. The cooling columns 182 are essentially heat transfer devices so that the transfer of heat from a base plate 184 to the flow augmenting rings 181 can be efficiently implemented. The spacings and sizes of the flow augmenting rings are selected so as to obtain the turbulent induced radial air flow as shown with arrows 186.

Figure 23:
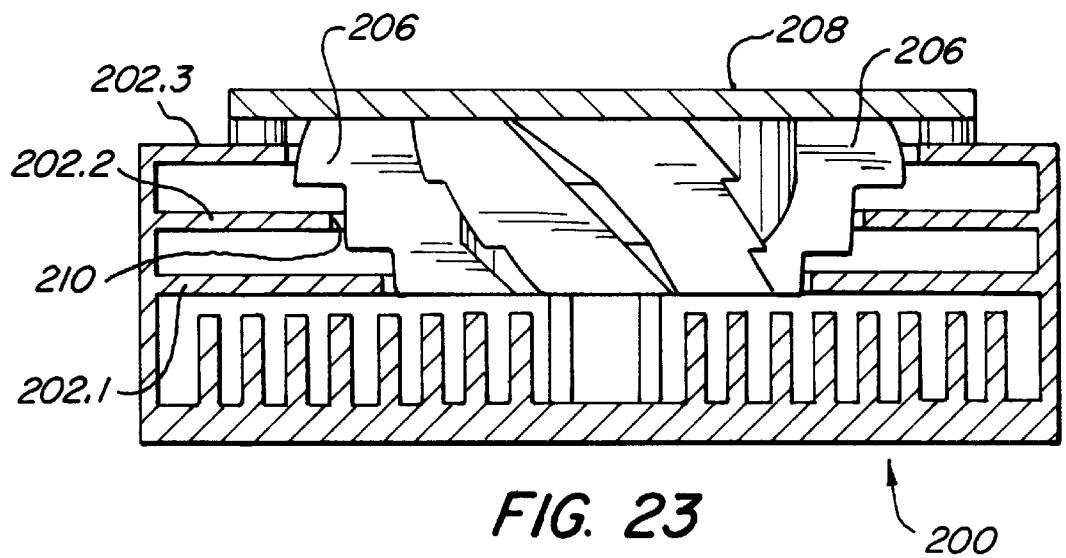
FIG. 23 is a side section view of the heat sink illustrated in FIG. 22 with a fan.
Figure 22:
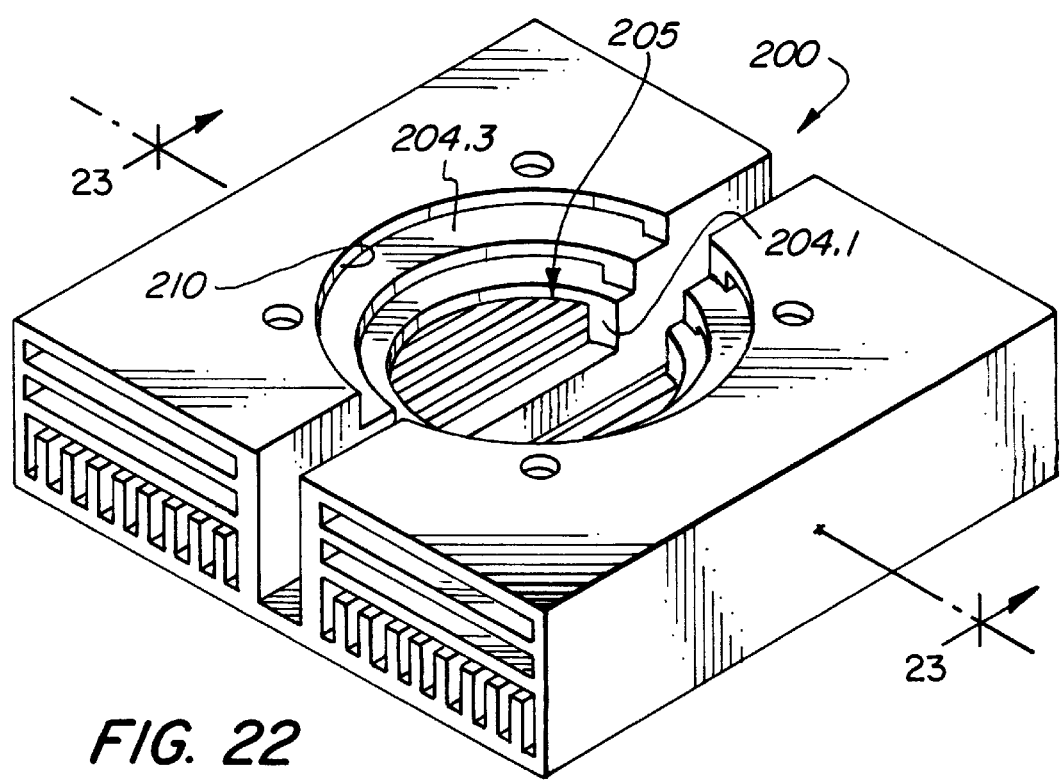
FIG. 22 is a perspective view of another heat sink of this invention with radially stepped flow augmenting rings for achieving a higher heat transfer coefficient.

FIGS. 22 and 23 show an extruded heat sink structure 200 that is similar to that shown for FIGS. 8 and 12. The flow augmenting rings 202, however, have differently sized central main air flow passages 204. These are selected so as present the lowest flow augmenting ring 202.1 with a larger surface area since that ring is likely to require the most cooling. Since the main air flow passage 205 is not uniformly sized as it is with the embodiments in the previous Figures, the propeller blades 206 of the fan 208 are also stepped. This enables the gap S between the propeller blades 206 and the adjacent inner edges 210 of the flow augmenting rings to be maintained within the desired range needed to disrupt the propeller tip vortices.

Figure 24:
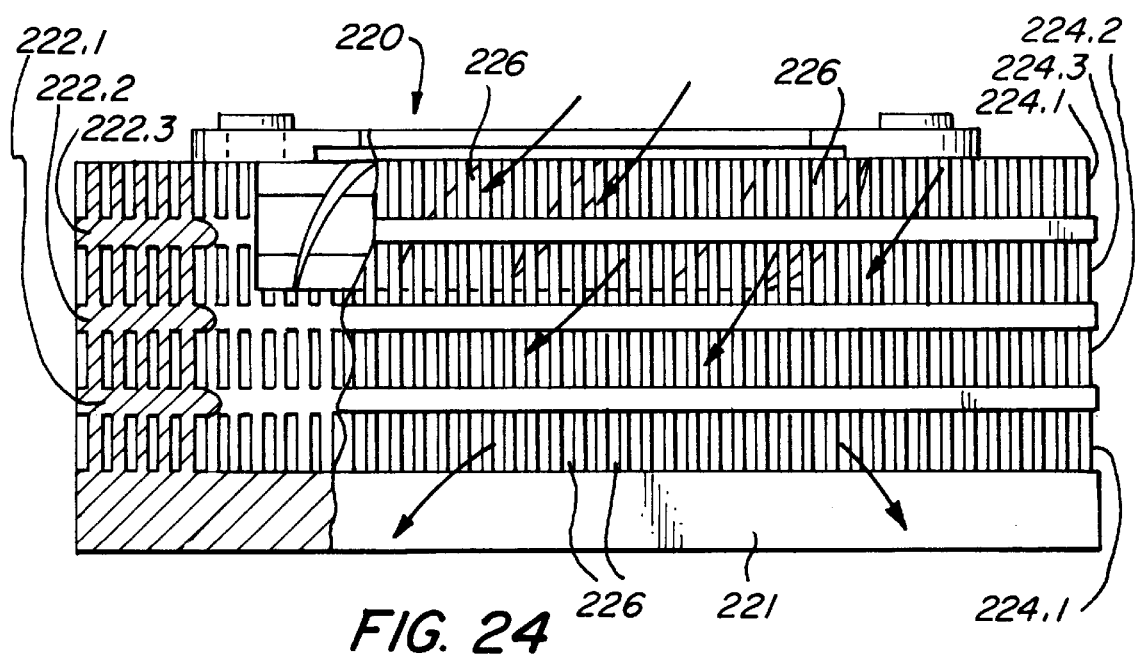
FIG. 24 is a side view in partial section of another heat sink in accordance with the invention wherein folded fins are employed between flow augmenting rings.

FIG. 24 shows a heat sink structure 220 wherein a base plate 221 is heat conductively coupled to upper located flow augmenting rings 222 by way of heat exchanger type fin structures 224 and the rings are in turn coupled to each other with similar fin structures 224. The orientation of the fin structures aligns air passages 226 so as to enable induced radial inward air flow to occur as with the previously described heat sinks of this invention. The use of the fin structures 224 both enhance the dispersion of heat from the base plate 221 as well provide a physical support of upper located flow augmenting rings 222 without the use of heat conducting columns. Each fin structure layer 224 can be formed of a single heat conducting sheet material that is subjected to multiple folds in a manner that is well known in the heat exchange art. The heat exchange layers can be brazed to the flow augmenting rings or the entire heat sink structure 220 clamped together with suitable clamps, not shown.

Having thus described several embodiments for a heat sink in accordance with the invention, its advantages can be appreciated. Variations from the embodiments can be made by one skilled in the art without departing from the scope of the following claims.

What is claimed is:

1. A heat sink for a heat generating device, comprising:

a heat conducting body having a base plate for placement in heat conducting relationship with the heat generating device and a plurality of spaced apart heat conducting flow augmenting rings with at least one air pumping aperture between the rings; said heat conducting body having end located columns in the form of elongate substantially solid walls extending from said base plate and connected to said flow augmenting rings in heat conducting relationship;

a main air flow passageway extending through said spaced apart rings and being sized to receive an axial fan with propeller blades extending towards a radially inward edge of the flow augmenting rings to deliver a main flow of air in an axial direction along said main air passageway and with a gap between the propeller blades and the inner radial edge of the rings selected to enable production of tip vortices from the propeller tips; and with ring chordal dimensions being effectively selected with respect to a radial dimension of the main air flow passageway so as to enable tip vortices from the propeller blades to be converted to useful air flow along said axial direction with a radially inwardly induced air flow between and over heat conducting flow augmenting rings that is a significant portion of the total mass flow generated along said main air flow passageway;

said rings being in heat conducting relationship with said base plate so as to transfer heat from the base plate to said heat conducting flow augmenting rings;

the axial width of said air pumping aperture between axially adjacent heat conducting flow augmenting rings being selected so as to enable said tip vortices to extend into the aperture and impinge upon radially inner regions of the rings and produce an annular area on at least one of said rings having a heat transfer coefficient $H_c$ of at least about 75 Watts/m$^2$/C.; so as to impart to said heat sink with said flow augmenting rings a high overall heat transfer characteristic $H_c$;

whereby the thermal resistance of said heat sink, when combined with said axial fan within the main air flow passageway, is reduced to a sufficiently low level so as to significantly enhance the removal of heat from said heat generating device.

2. The heat sink as claimed in claim 1 wherein said rings are respectively suspended from said end located columns.

3. The heat sink as claimed in claim 1 wherein said heat conducting body further is provided with spaced apart generally centrally located heat conducting columns extending up from said base plate, wherein each said spaced apart column is connected to a portion of said flow augmenting rings which extend outwardly from said spaced apart columns.

4. A heat sink for a heat generating device, comprising:

a heat conducting body having a base plate for placement in heat conducting relationship with the heat generating device and a plurality of spaced apart heat conducting flow augmenting rings with at least one air pumping aperture between the rings; said heat conducting body having spaced apart heat conducting columns extending up from said base plate, wherein each column is connected to a portion of said flow augmenting rings which extend outwardly from said columns in cantilever fashion;

a main air flow passageway extending through said spaced apart rings and being sized to receive an axial fan with propeller blades extending towards a radially inward edge of the flow augmenting rings to deliver a main flow of air in an axial direction along said main air passageway and with a gap between the propeller blades and the inner radial edge of the rings selected to enable production of tip vortices from the propeller tips; and with ring chordal dimensions being effectively selected with respect to a radial dimension of the main air flow passageway so as to enable tip vortices from the propeller blades to be converted to useful air flow along said axial direction with a radially inwardly induced air flow between and over heat conducting flow augmenting rings that is a significant portion of the total mass flow generated along said main air flow passageway;

said rings being in heat conducting relationship with said base plate through said columns so as to transfer heat from the base plate to said heat conducting flow augmenting rings;

the axial width of said air pumping aperture between axially adjacent heat conducting flow augmenting rings being selected so as to enable said tip vortices to extend into the aperture and impinge upon radially inner regions of the rings and produce an annular area on at least one of said rings having a heat transfer coefficient $H_c$ at least about 75 Watt/m$^2$/C.; so as to impart to said heat sink with said flow augmenting rings a high overall heat transfer characteristic $H_c$;

whereby the thermal resistance of said heat sink, when combined with said axial fan within the main air flow passageway, is reduced to a sufficiently low level so as to significantly enhance the removal of heat from said heat generating device.

5. The heat sink as claimed in claim 4 wherein said columns are located along at least one dimension of said base plate at a generally central region so as to enable said columns to be in proximity of heat coupled to the base plate from a heat generating device underneath a central part of the base plate.

6. The heat sink as claimed in claim 4 wherein said flow augmenting rings and said base plate have a rectangular perimeter.

7. The heat sink as claimed in claim 6 wherein said heat conducting body has first and second pairs of spaced apart columns adjacent the main air flow passageway and wherein said end located columns are elongate plates located along sides of the rectangular perimeter.

8. A heat sink for heat generating devices comprising:

an extruded metal heat conducting body having a base plate for placement in heat conducting relationship with the heat generating device and a plurality of spaced apart heat conducting flow augmenting rings with at least one air pumping aperture between the rings; said base plate having first and second columns extending upward therefrom respectively at different sides of the main air flow passageway and elongate substantially solid end located columns, wherein said flow augmenting rings extend in opposite directions from said first and second columns to connect with said end located columns and extend around said main air flow passageway;

a main air flow passageway extending through said spaced apart rings and being sized to receive an axial fan with propeller blades extending towards a radially inward edge of the flow augmenting rings to deliver a main flow of air in an axial direction along said main air passageway and with a gap between the propeller blades and the inner radial edge of the rings selected to enable production of tip vortices from the propeller tips; and with ring chordal dimensions being effectively selected with respect to a radial dimension of the main air flow passageway so as to enable tip vortices from the propeller blades to be converted to useful air flow along said axial direction with a radially inwardly induced air flow between and over heat conducting flow augmenting rings that is a significant portion of the total mass flow generated along said main air flow passageway;

said rings being in heat conducting relationship with said base plate through said columns so as to transfer heat from the base plate to said heat conducting flow augmenting rings;

the axial width of said air pumping aperture between axially adjacent heat conducting flow augmenting rings being selected so as to enable said tip vortices to extend into the aperture and impinge upon radially inner regions of the rings and produce an annular area on at least one of said rings having a heat transfer coefficient $H_c$ of at least about 75 Watts/m$^2$/C.; so as to impart to said heat sink with said flow augmenting rings a high overall heat transfer characteristic $H_c$;

whereby the thermal resistance of said heat sink, when combined with said axial fan within the main air flow passageway, is reduced to a sufficiently low level so as to significantly enhance the removal of heat from said heat generating device.

9. A heat sink for a heat generating device, comprising:

a heat conducting body having a base plate for placement in heat conducting relationship with the heat generating device and a plurality of spaced apart heat conducting flow augmenting rings with at least one air pumping aperture between the rings; and undulating heat conducting elements interposed between and interconnecting adjacent rings and having passages oriented to enable said radial air flow through the passages;

a main air flow passageway extending through said spaced apart rings and being sized to receive an axial fan with propeller blades extending towards a radially inward edge of the flow augmenting rings to deliver a main flow of air in an axial direction along said main air passageway and with a gap between the propeller blades and the inner radial edge of the rings selected to enable production of tip vortices from the propeller tips; and with ring chordal dimensions being effectively selected with respect to a radial dimension of the main air flow passageway so as to enable tip vortices from the propeller blades to be converted to useful air flow along said axial direction with a radially inwardly induced air flow between and over heat conducting flow augmenting rings that is a significant portion of the total mass flow generated along said main air flow passageway;

said rings being in heat conducting relationship with said base plate so as to transfer heat from the base plate through said undulating heat conducting elements to said heat conducting flow augmenting rings;

the axial width of said air pumping aperture between axially adjacent heat conducting flow augmenting rings being selected so as to enable said tip vortices to extend into the aperture and impinge upon radially inner regions of the rings and produce an annular area on at least one of said rings having a heat transfer coefficient $H_c$ of at least about 75 Watts/m$^2$/C.; so as to impart to said heat sink with said flow augmenting rings a high overall heat transfer characteristic $H_c$;

whereby the thermal resistance of said heat sink, when combined with said axial fan within the main air flow passageway, is reduced to a sufficiently low level so as to significantly enhance the removal of heat from said heat generating device.

10. A heat sink for a heat generating device, comprising:

a heat conducting body having a base plate for placement in heat conducting relationship with the heat generating device and a plurality of spaced apart heat conducting flow augmenting rings being formed of a multifolded heat conducting material with at least one air pumping aperture between the rings;

a main air flow passageway extending through said spaced apart rings and being sized to receive an axial fan with propeller blades extending towards a radially inward edge of the flow augmenting rings to deliver a main flow of air in an axial direction along said main air passageway and with a gap between the propeller blades and the inner radial edge of the rings selected to enable production of tip vortices from the propeller tips; and with ring chordal dimensions being effectively selected with respect to a radial dimension of the main air flow passageway so as to enable tip vortices from the propeller blades to be converted to useful air flow along said axial direction with a radially inwardly induced air flow between and over heat conducting flow augmenting rings that is a significant portion of the total mass flow generated along said main air flow passageway;

said rings being in heat conducting relationship with said base plate so as to transfer heat from the base plate to said heat conducting flow augmenting rings;

the axial width of said air pumping aperture between axially adjacent heat conducting flow augmenting rings being selected so as to enable said tip vortices to extend into the aperture and impinge upon radially inner regions of the rings and produce an annular area on at least one of said rings having a heat transfer coefficient $H_c$ of at least about 75 Watts/m$^2$/C.; so as to impart to said heat sink with said flow augmenting rings a high overall heat transfer characteristic $H_c$;

whereby the thermal resistance of said heat sink, when combined with said axial fan within the main air flow passageway, is reduced to a sufficiently low level so as to significantly enhance the removal of heat from said heat generating device.

11. A heat sink for removing heat from heat generating devices comprising:

a heat conducting body having a base plate for placement in heat conducting relationship with the heat generating device and a plurality of spaced apart heat conducting flow augmenting rings with at least one air pumping aperture between the rings; at least one elongate column affixed to said base plate and coupled to support said flow augmenting rings above said base plate so as to transfer heat from the base plate to said heat conducting augmenting rings; said flow augmenting rings being suspended form said column in cantilever fashion;

a main air flow passageway extending through said spaced apart flow augmenting rings;

an axial fan sized to fit inside the main air flow passage way and having propeller blades which extend towards a radially inward edge of the flow augmenting rings to deliver a main flow of air in an axial direction along said main air passageway and with a gap between the propeller blades and the inner radial edge of the rings selected to enable production of tip vortices from the propeller tips;

the axial width of said air pumping aperture between axially adjacent heat conducting flow augmenting rings being selected so as to enable said tip vortices to extend into the aperture and impinge upon radially inner portions of the rings and with ring chordal dimensions being effectively selected with respect to a radial dimension of the main air flow passageway so as to enable tip vortices from the propeller blades to be converted to useful air flow along said axial direction with a radially inwardly induced air flow between and over heat conducting flow augmenting rings so as to impart to said heat sink with said flow augmenting rings a high overall heat transfer coefficient $H_c$;

whereby the thermal resistance of said heat sink, when combined with said axial fan within the main air flow passageway, is reduced to a sufficiently low level so as to significantly enhance the removal of heat from said heat generating device.

12. The heat sink as claimed in claim 11 wherein said heat conducting body has spaced apart heat conducting columns extending up from said base plate and wherein each column is connected to a portion of said flow augmenting rings which extend outwardly from said columns in cantilever fashion.

13. A heat sink for heat generating devices comprising:

a heat conducting body for placement in heat conducting relationship with the heat generating device and a plurality of spaced apart heat conducting flow augmenting rings with at least one air pumping aperture between the rings;

a main air flow passageway extending through said spaced apart rings and being sized to receive an axial fan with propeller blades extending towards a radially inward edge of the flow augmenting rings to deliver a main flow of air in an axial direction along said main air passageway and with a gap between the propeller blades and the inner radial edge of the rings selected to enable production of tip vortices from the propeller tips; and with ring chordal dimensions being effectively selected with respect to a radial dimension of the main air flow passageway so as to enable tip vortices from the propeller blades to be converted to useful air flow along said axial direction with a radially inwardly induced air flow between and over heat conducting flow augmenting rings;

a heat conducting column in the form of a heat conducting cooling pipe for heat conducting relation ship with said heat generating device and coupled to support said flow augmenting rings and transfer heat thereto; said cooling pipe comprising a thermoelectric cooling column;

the axial width of said air pumping aperture between axially adjacent heat conducting flow augmenting rings being selected so as to enable said tip vortices to extend into the aperture and impinge upon radially inner regions of the rings;

whereby the thermal resistance of said heat sink, when combined with said axial fan within the main air flow passageway, is reduced to a sufficiently low level so as to significantly enhance the removal of heat from said heat generating device.

* * * * *